United States Patent [19]
Nishimoto et al.

[11] Patent Number: 5,740,070
[45] Date of Patent: Apr. 14, 1998

[54] APPARATUS FOR AUTOMATICALLY GENERATING LOGIC CIRCUIT

[75] Inventors: Masakazu Nishimoto; Tetsuo Furuichi; Takeyoshi Hashimoto; Takahiro Masuda, all of Suita, Japan

[73] Assignee: Mega Chips Corporation, Osaka, Japan

[21] Appl. No.: 895,375

[22] Filed: Jun. 9, 1992

[30] Foreign Application Priority Data

| Jun. 11, 1991 | [JP] | Japan | 3-168935 |
| Nov. 28, 1991 | [JP] | Japan | 3-342156 |
| Jan. 7, 1992 | [JP] | Japan | 4-020493 |

[51] Int. Cl.$^6$ .................................. H03K 19/00
[52] U.S. Cl. ............................................ 364/490
[58] Field of Search .......................... 364/488, 489, 364/490, 491, 521

[56] References Cited

U.S. PATENT DOCUMENTS

| 4,922,432 | 5/1990 | Kobayashi et al. | 364/490 |
| 4,964,056 | 10/1990 | Bekki et al. | 364/488 |
| 5,029,102 | 7/1991 | Drumm et al. | 364/489 |
| 5,146,583 | 9/1992 | Matsunaka et al. | 395/500 |
| 5,371,683 | 12/1994 | Fukazawa et al. | 364/489 |

FOREIGN PATENT DOCUMENTS

| 61-88371 | 7/1984 | Japan . |
| 2-7171 | 1/1990 | Japan . |

OTHER PUBLICATIONS

"i-Logix", Express VHDL, Design Automation Conference, Jun. 1991.
"i-Logix", Express VHDL, Convention Center, Jun. 1992.

*Primary Examiner*—Kevin J. Teska
*Assistant Examiner*—Stephen J. Walder, Jr.
*Attorney, Agent, or Firm*—Lowe, Price, LeBlanc & Becker

[57] ABSTRACT

According to an apparatus for automatically generating a logic circuit, when a request specification represented by a state transition diagram is input to the apparatus, the apparatus divides the specification into an information control part and an information processing part, divides the information control part into a transition state generator and a control signal generator, and specifies the transition state generator, the control signal generator, and the information processing part, as combinations of circuits, which are realized by combinations of logic elements and wirings, and wirings connecting the circuits. Therefore, the apparatus can easily cope with a change of use of the logic circuit, a change of a library of a final product, and the like. In addition, when only the state transition diagram, which represents request functions of the logic circuit naturally and compactly and which is easily described by an operator, is input to the apparatus, a large scale logic circuit can be automatically generated, thereby significantly reducing a time for developing the circuit.

11 Claims, 16 Drawing Sheets

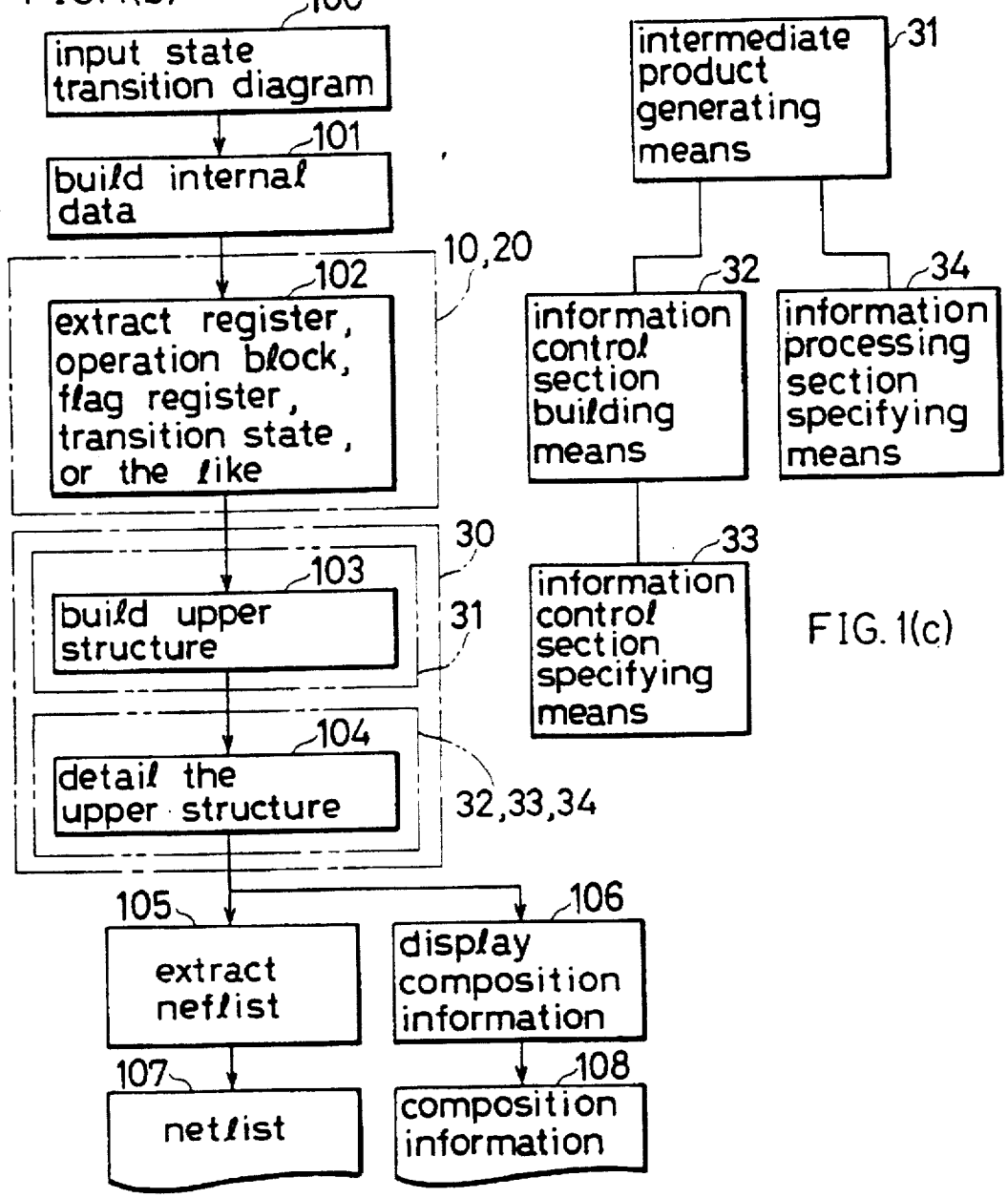

FIG.18
| logic element | operation | |
|---|---|---|
|  | AND | logic product |
|  | OR | logical sum |
| 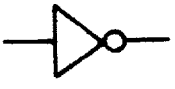 | NOT | logical negation |
|  | XOR | exclusive logical sum |
| 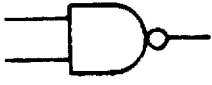 | NAND | negative logical product |
|  | NOR | negative logical sum |

APPARATUS FOR AUTOMATICALLY GENERATING LOGIC CIRCUIT

FIELD OF THE INVENTION

The present invention relates to an apparatus for automatically generating a logic circuit and, more particularly, to an apparatus for automatically generating an object of the logic circuit in an expression style to a specification input by an operator in a CAD (Computer Aided Design).

BACKGROUND OF THE INVENTION

In a conventional apparatus for generating a logic circuit, required functions are generated by combining logic elements like those shown in FIG. 18. Therefore, a manual operation for combining the logic elements is required and an operator must have knowledge of each logic element as well as knowledge of a functional circuit realized by the combination of the logic elements. Such a manual operation by the operator with special knowledge makes it difficult to reduce a development time of the circuit.

Meanwhile, an apparatus, which automatically generates a logic circuit without requiring the special knowledge, has been developed. When a hardware description language (hereinafter referred to as HDL) is input to this apparatus, the apparatus automatically converts the HDL to an object of a logic circuit that satisfies a request specification.

An example of conventional logic circuit composing system is disclosed in Japanese Patent Published Application No. 2-7171. In this device, when a function description language at register level is input, a macro-expansion rule base forms an intermediate code and a conversion rule base element automatically converts the intermediate code to a net list. When the net list after the conversion is input to a VLSI CAD tool, mask data satisfying the request specification is obtained. Therefore, even an operator without special knowledge of circuit elements can design an integrated circuit satisfying the request specification by only describing required functional specification for the integrated circuit.

In the conventional logic circuit synthesizer, however, it is necessary to describe the specification of the logic circuit by the function description language, which is not easily recognized by intuition, with imagining a final structure of the circuit, so that it requires a great deal of skill to form the required specification. In addition, it is difficult to confirm whether an input is correct.

Furthermore, although the HDL is used for the description of specifications of a circuit to be composed, in order to produce an actually effective circuit, it is necessary to describe informations relating to the structure of the circuit to be composed but not directly relating to the request specifications. The description relating to the synthesis of the circuit is difficult because it should be described mixing into a part showing the specifications. In addition, it is difficult to read out the specifications of the circuit to be composed from the once described HDL. Similarly, it is difficult to read out a part showing the structure of the circuit to be composed.

SUMMARY OF THE INVENTION

The present invention is directed to solving the above-described problems and has for its object to provide an apparatus for automatically generating a logic circuit, to which request specifications of the circuit described by a graphic expression, which is easily formed by an operator, are input, that easily copes with a change of use of the logic circuit and a change of specifications of a library of a cell, that represents functions of the logic circuit naturally and compactly, and that converts the request specifications described by the graphic expression to objects in an expression style of the logic circuit satisfying the request specifications.

It is another object of the present invention to provide an apparatus for automatically generating a logic circuit with high efficiency in which specifications are easily read and informations relating to a structure of a circuit to be composed are easily understood.

It is still another object of the present invention to provide an apparatus for automatically generating a logic circuit, in which operating speed of the whole circuit is not restricted by an operation which takes the longest time among operations of circuit blocks, whereby a high-speed logic circuit is achieved even if the circuit is very large in scale.

Other objects and advantages of the present invention will become apparent from the detailed description given hereinafter; it should be understood, however, that the detailed description and specific embodiment are given by way of illustration only since various changes and modifications within the spirit and scope of the invention will become apparent to those skilled in the art from this detailed description.

According to a first aspect of the present invention, when request specifications represented by a state transition diagram are input to an apparatus for automatically generating a logic circuit, a transition information between states in the state transition diagram and a processing content of each state are extracted and an object of the logic circuit in an expression style is generated in accordance with the transition information between the states and the processing content in each state.

According to a second aspect of the present invention, in the generation of the object of the logic circuit, a function to be included in the logic circuit is divided into an information control part and an information processing part by intermediate product generating means, the information control part is divided into a transition state generator and a control signal generator by information control part building means, the transition state generator and the control signal generator are specified as combinations of circuits, which are realized by combinations of logic elements and wirings, and wirings connecting the circuits by information control part specifying means, and the information processing part is specified as a combination of circuits, which are realized by combinations of logic elements and wirings, and wiring connecting the circuits by information processing part specifying means. In this way, the function of the logic circuit is successively fractionized to conduct a logic composition. Therefore, even if a use of the logic circuit or a library of a cell is changed, it is only necessary to change a step corresponding to the change, which means that the apparatus easily cope with the change of specifications. In addition, since the state transition diagram, which represents request functions of the logic circuit naturally and compactly and which is easily described by an operator, is input to the apparatus, even an operator with no knowledge of logic elements and combinations thereof can generate a logic circuit.

According to a third aspect of the present invention, an apparatus for automatically generating a logic circuit includes means for designating a method for composing a circuit to be generated by a graphic input. Therefore, specifications are easily made out, resulting in an apparatus with high efficiency.

According to a fourth aspect of the present invention, an apparatus for generating an object of a logic circuit realizing a specification described by either or both of a diagram and a hardware description language, which are input from the outside, includes means for designating a method for composing a circuit that realizes the described specification by a graphic input. Therefore, the specification is easily made out. In addition, since informations relating to a structure of the circuit to be composed can be input by a diagram, contents thereof can be easily made out. As the result, an apparatus with high efficiency is achieved.

According to a fifth aspect of the present invention, an apparatus for automatically generating a logic circuit includes means for extracting portions of specifications, input from the outside, which portions can be unified and realized by an object of logic circuit, and displaying the portions as a diagram to an operator. Therefore, informations relating to a structure of the circuit to be composed are represented by a graphic input, so that specifications can be easily made out. In addition, the informations relating to the structure of the circuit to be composed are easily understood by a diagram and the operator can indicate the shareable circuit by a support of the apparatus. As the result, an apparatus with high efficiency can be achieved.

According to a sixth aspect of the present invention, an apparatus for automatically generating a logic circuit includes means for designating portions, which are realized by an object of logic circuit and are not included in the above-described specifications, by a graphic input by an operator. Therefore, informations relating to a structure of a circuit to be composed are represented by a graphic input, so that specifications can be easily made out. In addition, even portions which cannot be unified and shared by the support of the apparatus can be indicated, resulting in an apparatus with high efficiency.

According to a seventh aspect of the present invention, an apparatus for automatically generating a logic circuit includes means for automatically composing a circuit, which generates a control signal at a speed corresponding to a performance of a circuit to be controlled, in a part serving as a controller for the circuit to be composed. Therefore, a high-speed circuit can be generated even when the circuit is very large in scale.

According to an eighth aspect of the present invention, an auxiliary counter function is provided in the part serving as a controller for the circuit to be composed. Therefore, a circuit of the part serving as a controller can be simplified.

According to a ninth aspect of the present invention, a value obtained by automatically calculating an operating speed of every circuit to be controlled is used as a value to be set in the auxiliary counter function. Therefore, a circuit, that generates a signal adjusted to the operating speed of each state, can be composed without requiring manual operation.

BRIEF DESCRIPTION OF THE DRAWINGS

FIGS. 1(a)–1(c) are diagrams showing an apparatus for automatically generating a logic circuit in accordance with a first embodiment of the present invention, in which FIG. 1(a) shows a hardware thereof, FIG. 1(b) is a flow chart showing a logic circuit generating process, and FIG. 1(c) shows an internal structure of a logic circuit object generating means;

FIG. 18 is a diagram showing conventional logic elements and operations thereof.

DETAILED DESCRIPTION OF THE PREFERRED EMBODIMENTS

Figure 2A:
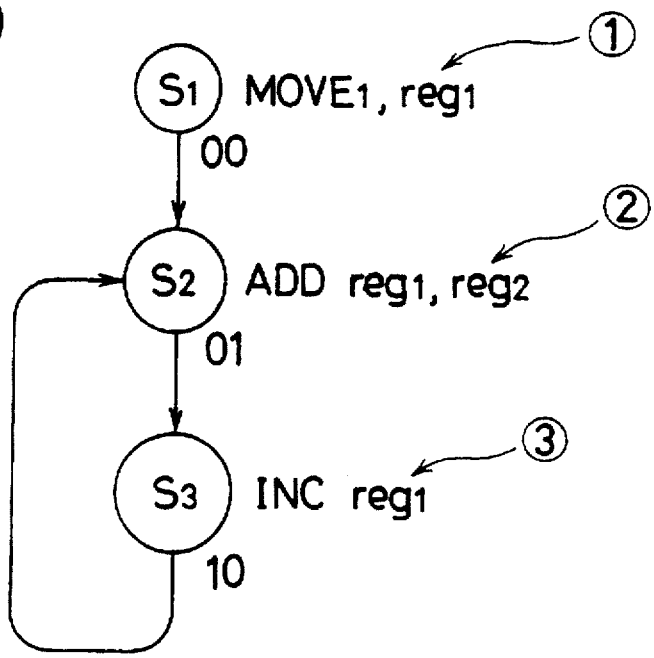
FIGS. 2(a)–2(b) are diagrams showing an example of state transition.

FIG. 1(a) is a block diagram showing a hardware structure of an automatic logic circuit generating apparatus in accordance with a first embodiment of the present invention. In FIG. 1(a), reference numeral 1 designates a work station computer and numeral 2 designates a memory device, such as a magnetic disk device, included in the work station computer 1. Reference numeral 3 designates a display station, such as a high resolution CRT. Reference numeral 4 designates a pointing apparatus, such as a mouse or a stylus. In this embodiment, a mouse is employed. This hardware structure is only one instance among many and it is needless to say that a personal computer or a mainframe computer may be used.

Figure 2B:
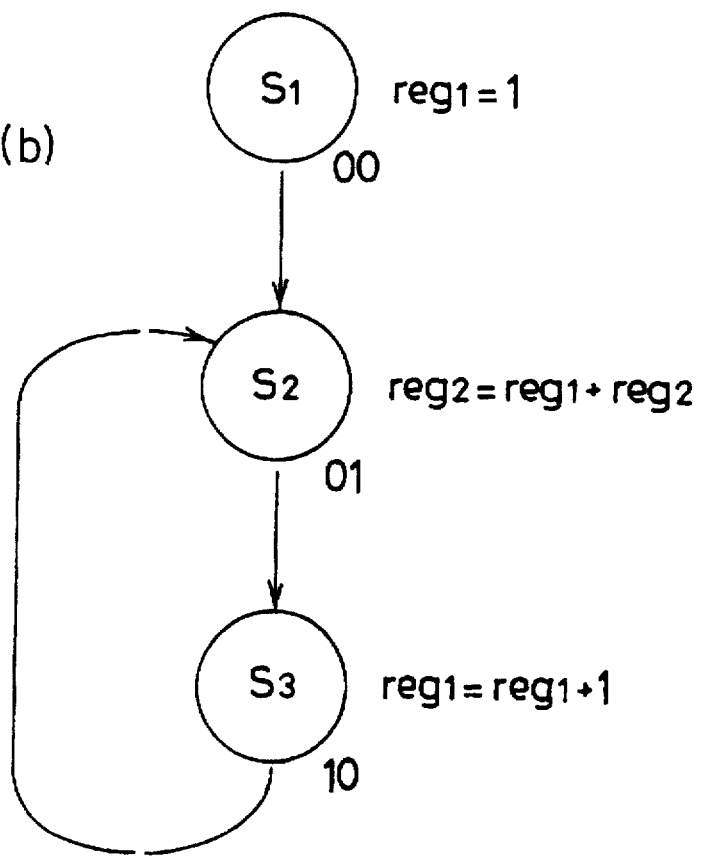

FIG. 2 is a state transition diagram, which is input to the apparatus of FIG. 1(a), showing an example of a functional specification of a logic circuit. In FIG. 2, a value "1" is input to a register 1 in a state S1. In a state S2, a value obtained by adding the content of the register 1 to a register 2 is input to the register 2. In a state S3, "1" is added to the content of the register 1. Hereinafter, the operations of the states S2 and S3 are repeated to increase the content of the register 2 by "1" at a time.

In FIG. 2, nodes S1, S2, and S3 show possible states of the circuit, and ①, ②, and ③ show instructions as processing contents in the respective states. Arcs (arrows) connecting the states show that the circuit takes a state designated by the arrowhead after an instruction was executed in a state. The instructions may be classified into "transfer", "logic operation", "arithmetic operation", "shift operation", and "bit operation". MOVE is provided for "transfer", AND, OR, NOT, and XOR are provided for "logic operation", ADD, SUB, INC and DEC are provided for "arithmetic operation", SHR and SHL are provided for "shift operation", and BCHG, BCLR, and BSET are provided for "bit ooperation". The instruction in each state comprises a plurality of tokens and the tokens may be classified into two groups, i.e., an information showing a kind of the operation (operation code) and an information showing an object of the operation (operand). When there are a plurality of operands, each operand will be a data to be processed (source) or a processed data (destination). For example, the state 1 comprises three tokens, i.e., "MOVE", "1", and "reg1", and "MOVE" corresponds to the operation code while "1" and "reg1" correspond to the operands. Between the two operands, "1" corresponds to the source and "reg 1" corresponds to the destination.

The state S1 of FIG. 2 shows that the circuit takes the state S2 after the value "1" is input to a memory circuit (hereinafter referred to as register) reg1. Similarly, the state S2 shows that the circuit takes the state S3 after the result of the addition of the registers reg1 and reg2 is input to the register reg2.

Similarly, the state S3 shows that the circuit takes the state S2 after the value "1" is added to the reg1 and the result of the addition is input to the reg1.

Figure 3:
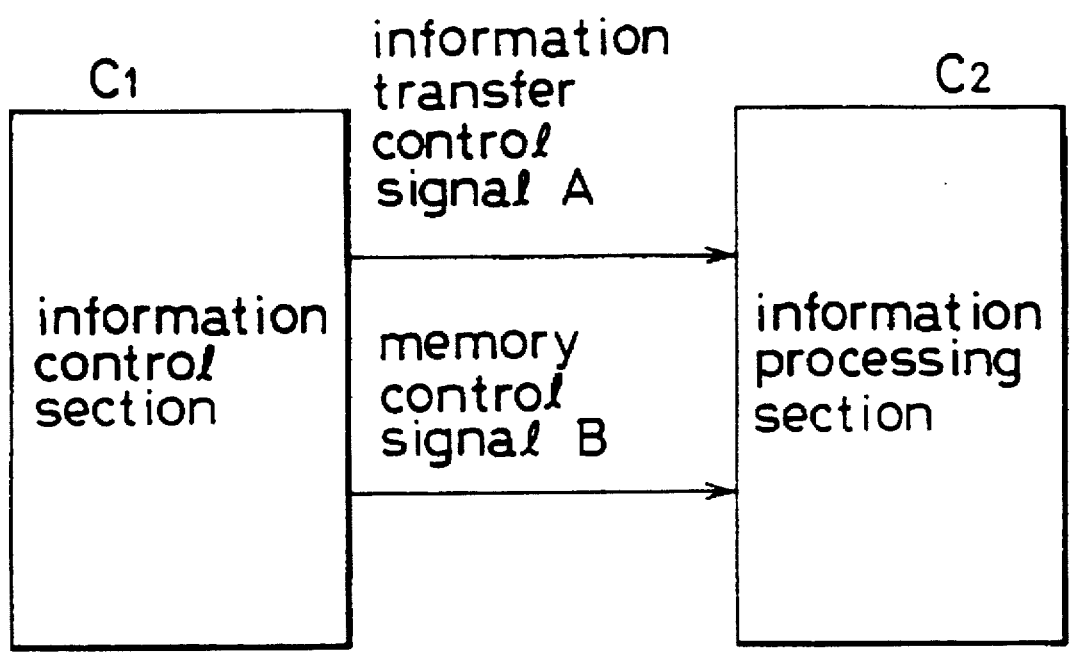
FIG. 3 is a diagram in which a function of a logic circuit to be composed by the apparatus of FIG. 1 is divided broadly.

FIG. 3 is a block diagram showing a state where the processing content to be included in a logic circuit is divided into two in accordance with the functional specification of FIG. 2. An information control section C1 shown in FIG. 3 generates an information transfer control signal A, which determines an information transfer path to the register, and a memory control signal B, which controls the input to the register, with observing the registers processed in the states S1, S2, and S3 shown in FIG. 2.

An information processing section C2 shown in FIG. 3 has an information processing function in accordance with the state transition diagram of FIG. 2 in response to the information transfer control signal A and the memory control signal B.

Figure 4A:
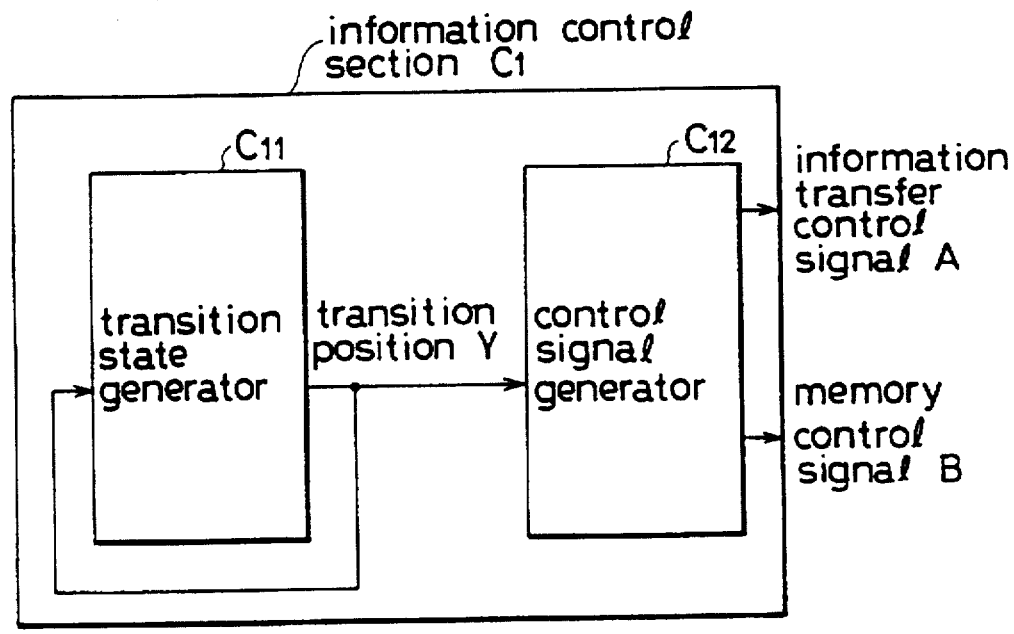
FIGS. 4(a)–4(b) are block diagrams in which a information control section C1 of FIG. 3 is detailed.
Figure 6:
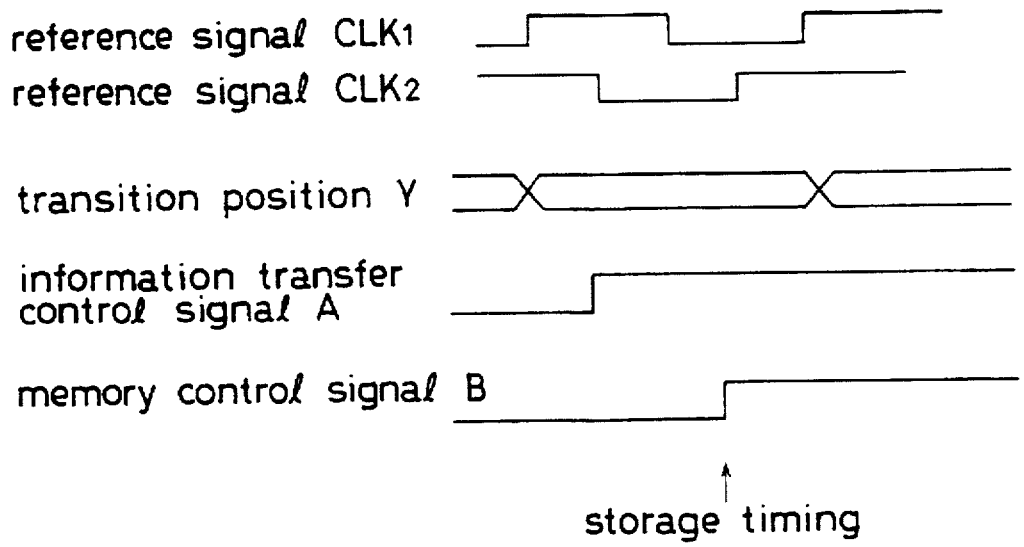
FIG. 6 is a diagram showing timings of control signals output from the information control section of FIG. 3.

FIG. 4(a) is a block diagram showing an internal structure of the information control section C1 of FIG. 3 in more detail. In FIG. 4(a), a transition state generator C11 decides a state which follows the current state in each state of S1, S2, and S3 and outputs a transition position information Y. A control signal generator C12 outputs an information transfer control signal A, which controls the information transfer process of the information processing section C2, and a memory control signal B, which controls a memory process, as shown in FIG. 6, in accordance with the transition position information Y generated from the transition state generator C11. The transition state generator C11 is divided into a transition state computer C111 and a transition state memory C112. In addition, reference signals CLK1 and CLK2 shown in FIG. 6 designate reference clocks used in the information control section C1.

Figure 4B:
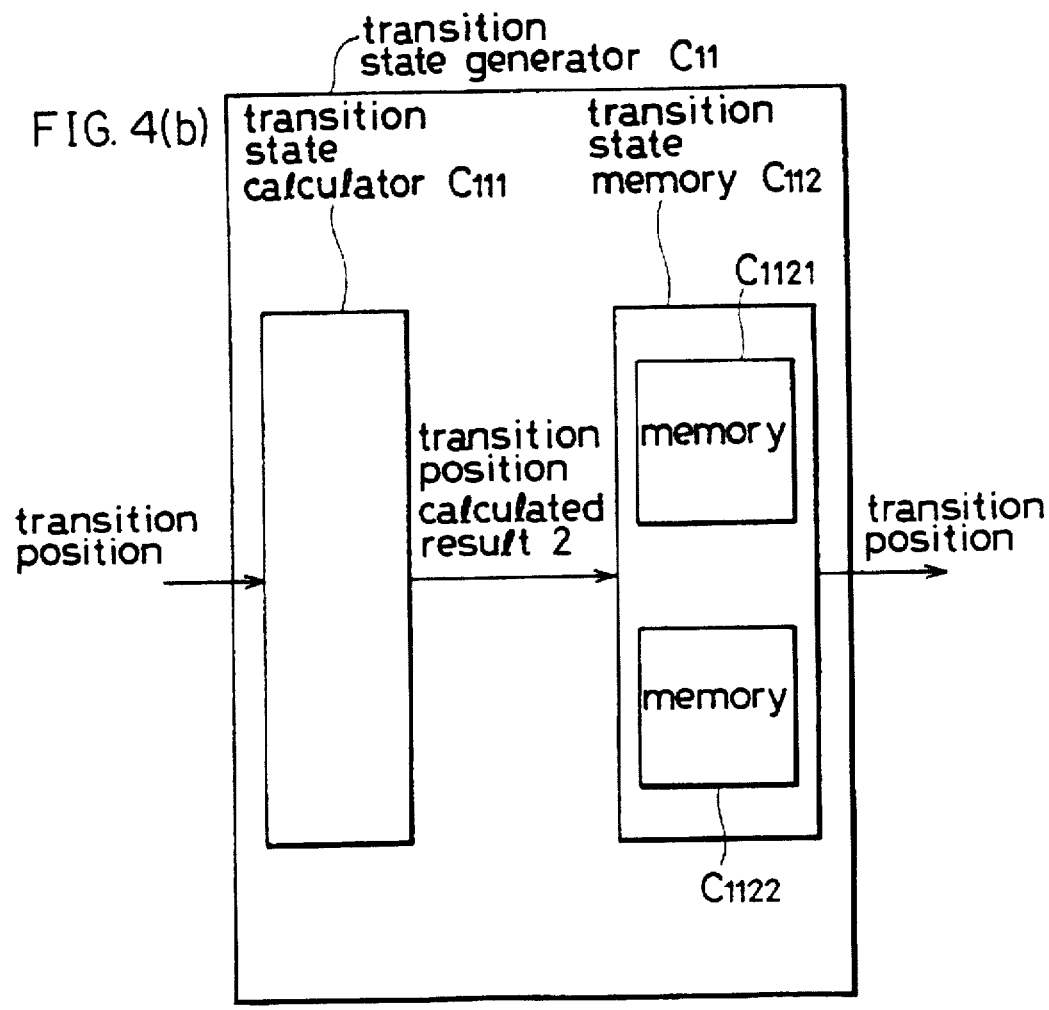
Figure 5:
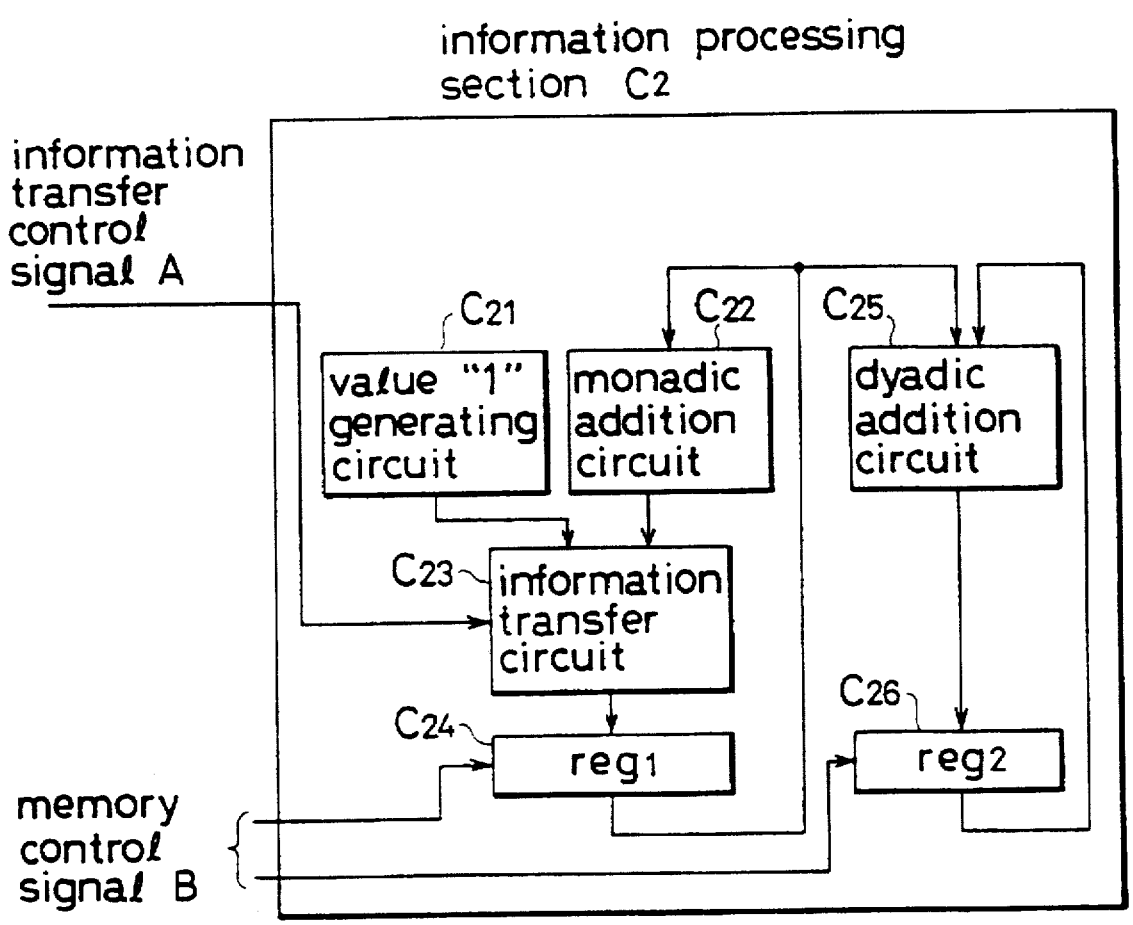
FIG. 5 is a block diagram in which an information processing section of FIG. 3 is detailed.

FIG. 5 is a block diagram showing an internal structure of the information processing section C2 of FIG. 3 in more detail. The information transfer control signal A of FIG. 5 is output from the control signal generator C12 of FIG. 4 and controls the information transfer of the information transfer circuit C23. The memory control signal B is output from the control signal generator C12 of FIG. 4 and controls hold and change of informations in the registers reg1 C24 and reg2 C26.

In FIG. 5, a value "1" generating circuit C21 outputs an information of the value "1" and the information is transferred to the information transfer circuit C23. In a monadic addition circuit C22, "1" is added to an information input thereto and the result is transferred to the information transfer circuit C23. The information transfer circuit C23 outputs either the information from the value "1" generating circuit C21 or the information from the monadic addition circuit C22 in accordance with an information transfer control signal, and the output is input to the register reg1 C24. The register reg1 C24 holds the information from the information transfer circuit C23 in accordance with a memory control signal and then outputs the information. The information output from the register reg1 C24 is input to the monadic addition circuit C22 and a dyadic addition circuit C25. In the dyadic addition circuit 25, informations from the registers reg1 C24 and reg2 C26 are added to each other and the result is input to the register reg2 C26. The register reg2 C26 holds the information from the dyadic addition circuit C25 in accordance with the memory control signal and then outputs the information. The information output from the register reg2 C26 is input to the dyadic addition circuit C25.

Figure 7:
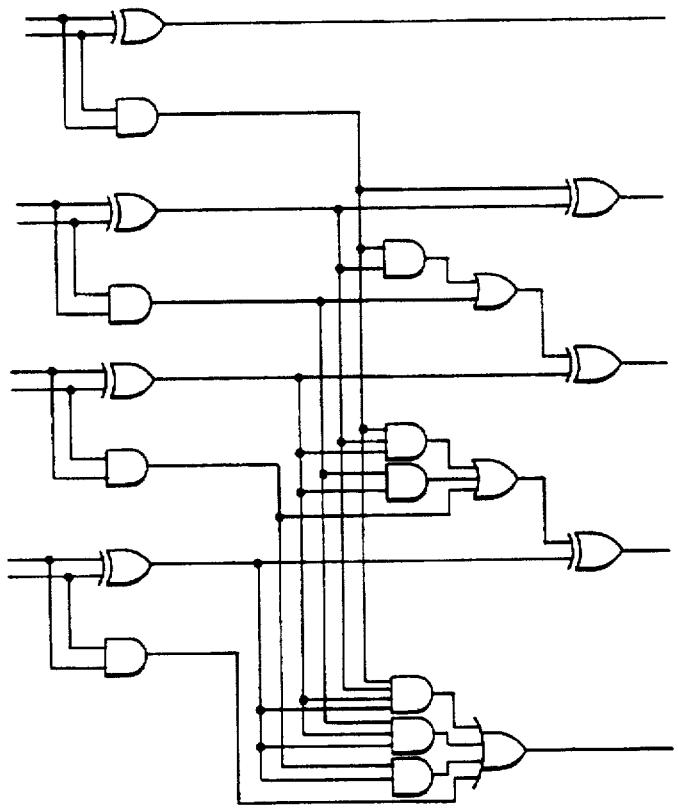
FIG. 7 is a diagram showing a dyadic addition circuit of FIG. 5 at a gate level.

FIG. 7 is a schematic diagram illustrating the dyadic addition circuit C25 at a gate level. It is needless to say that other blocks in the information processing section can be illustrated in like manner.

In the first embodiment of the present invention, the processing content of the functional specification of a logic circuit to be realized is divided into two sections as shown in FIG. 3 on the basis of the functional specification input shown in FIG. 2. Then, each section is realized by the single function circuits and wirings connecting the single function circuits as shown in FIGS. 4 and 5. In this way, a logic circuit is automatically generated.

FIG. 1(b) is a flow chart for automatically generating a logic circuit by the work station shown in FIG. 1(a). In step 100, a state transition diagram is input. In step 101, an internal data is built in accordance with the state transition diagram. In step 102, informations, such as register, operation block, flag register, transition state, and the like, are extracted with reference to the internal data built in the step 101. In step 103, an upper structure, in which functions to be included in the logic circuit are roughly classified, is built on the basis of the informations extracted in the step 102. In step 104, the upper structure is successively detailed into a plurality of stages. In step 105, a net list 106 is extracted from the structure detailed in the step 104. In step 106, parameters showing performances of a circuit to be composed, such as delay time, number of logic elements, and the like, are output.

Among these steps, the step 102 corresponds to a transition information input means 10 and a processing content input means 20. The transition information input means 10 extracts a transition information between states in the state transition diagram and the processing content input means 20 extracts a processing content in each state in the state transition diagram.

The steps 103 and 104 correspond to a logic circuit result generating means 30 which produces an object in an expression style of a logic circuit by the transition information between states and the processing content in each state.

More specifically, the step 103 corresponds to an intermediate product generating means 31 which generates an intermediate product comprising an information control section and an information processing section. The information control section outputs an information transfer path controlling signal, which selects a transfer path of the information, and a memory control signal which specifies some of a plurality of memories and controls write timing of the memories. The information processing section includes a computer conducting an operation of the processing content in each state in the state transition diagram in response to the information transfer path control signal and the memory control signal which are input to the computer.

The step 104 corresponds to an information control section building means 32, an information control section specifying means 33, and an information processing section specifying means 34. More specifically, the information control section building means 32 builds the information control section comprising a transition state generator and a control signal generator. The transition state generator outputs an information of a next transition position in response to a control signal showing characteristics and contents of the operation result of the information processing section and a transition position information output from the information control section itself. The control signal generator generates the information transfer path control signal and the memory control signal in response to the transition position information from the transition state generator. The information control section specifying means 33 specifies the transition state generator and the control signal generator as combinations of memory circuits, logical operation circuits, signal selecting circuits, and value generating circuits, which are realized by combinations of logic elements and wirings. The information processing section specifying means 34 specifies the information processing section as a combination of memory circuits, logical operation circuits, signal selecting circuits, and value generating circuits, which are realized by combinations of logic elements and wirings, in accordance with grammatical specifications of instructions written in the state transition diagram.

A description is given of the operation. An operator inputs the state transition diagram to the work station computer 1 using the mouse 4 while referring to the display station 3 (step 100). For example, a window displayed on the display station 3 is opened and states are input using a menu displayed above the window. Then, transition order of the states is denoted by arcs, and input of instructions, definition of registers, and the like are performed.

The state transition diagram thus input to the work station 1 is converted to an internal data and stored in the memory device 2 in the work station 1 (step 101). In the case where the internal data is an arc, a starting point and an end point of the arc are specified by coordinates at the starting point and the end point of the arc to convert the arc to a simple transition information between states, whereby only semantic information is extracted from the state transition diagram that is an analog diagram. Therefore, the following process is simplified as compared with a case where the state transition diagram is stored as it is. In addition, when an undesired state transition diagram is unfavorably input by a maloperation or the like, it is possible to correct the input easily by the mouse 4.

When a desired state transition diagram is formed in this way and input to the work station computer 1, the operator instructs the work station computer 1, by the mouse 4, to execute a circuit composition.

Receiving this instruction, the work station computer 1 builds a circuit structure described hereinbelow using the internal data in the memory device 2. First of all, in the step 102, informations of the register, operation block, flag register, transition state, and the like, which are necessary for achieving the circuit, are extracted from the state transition diagram information converted to the internal data. In this step, the state transition diagram information is divided into a transition information and an instruction part comprising a plurality of tokens, and the instruction in each state is divided into a register which is operated, referred, or input, a state which follows the state, and a condition of the transition.

Then, in the step 103, the intermediate product generating means 31 builds an upper structure on the basis of these informations. More specifically, a logic circuit to be composed is divided into a plurality of blocks whose internal structures are not decided yet, i.e., it is divided into two intermediate products, i.e., the information processing section that processes the data shown by the state transition diagram and the information control section that provides operation timing of the information processing section. Then, wiring is performed so that the information control section may output an information transfer control signal and a memory control signal to the information processing section. At this time, internal structures of the processes in the information processing section and the information control section and the contents of the information transfer control signal and the memory control signal are not decided yet.

In the step 103, addition or change can be made to the upper structure building means from the outside. Therefore, even if a use of a logic circuit to be designed is changed, for example, a change from a signal processing circuit to a machine control circuit, the logic circuit generating apparatus of the present invention can cope with the change.

In the step 104, the upper structure formed in the step 103 is divided using various informations extracted in the step 102, thereby to decide the internal structure of the upper structure. This structure division comprises a plurality of stages. More specifically, the information control section building means 32 divides the internal structure of the information control section into a transition state generator and a control signal generator. The information control section specifying means 33 represents functions and the like of the transition state generator and the control signal generator by a truth table and realizes the functions and the like by combinations of logic elements and wirings. The information processing section specifying means 34 details the processing content of the information processing section into combinations of logic elements and wirings, such as value generating circuit, monadic addition circuit, dyadic addition circuit, information transfer circuit, register (memory circuit), and the like and performs a development for realizing thus detailed function blocks by conventional logic elements. Also in the step 104, addition or change can be made to the structure dividing means from the outside. Therefore, even if a library of a cell (a set of circuit elements used for the composition) is changed, the logic circuit generating apparatus of the present invention can cope with the change.

The step 104 will be described in more detail.

1. First of all, the information control section C1 generated in the step 103 is divided into the transition state generator C11 and the control signal generator C12. Then, wiring is carried out so that the control signal generator C12 may output the information transfer control signal A and the memory control signal B to the outside and the transition state generator C11 may output the transition position signal to itself and the control signal generator C12. At this time, internal structures of the transition state generator C11 and the control signal generator C12 and a content of the transition position signal are not decided yet.

2. Then, the transition state generator C11 is divided into the transition state calculator C111 and the transition state memory C112 and wiring is carried out so that the transition state calculator may output the transition state calculation result Z to the transition state memory. At this time, internal structures of the transition state calculator C111 and the transition state memory C112 and a content of the transition state calculation result Z are not decided yet.

3. Then, the internal structure of the transition state memory C112 is decided. More specifically, registers (memories) as many as the number of digits of a binary that represents the number of states in the state transition diagram are prepared. In this embodiment, since the number of states is four, two registers C1121 and C1122 are prepared. Then, wiring is carried out so that output terminals of the registers C1121 and C1122 may be connected to the transition position information and input terminals thereof may be connected to the transition state calculator C111.

4. Then, the internal structure of the transition state calculator C111 is decided. More specifically, a truth table, in which the input transition position is shown as input and the transition state position to be processed next is shown as output, is formed in the transition state calculator C111. An input-output relation of the truth table is specified by the connection (arc) between states in the state transition diagram and the condition.

5. Then, the internal structure of the control signal generator C12, which outputs a control signal to the information processing section, is decided. This decision is made by forming a truth table so that signals to be input to the calculator may be selected in accordance with the instruction in each state of the state transition diagram and the memory to be input in each state may be controlled. In this truth table, the transition position information is shown as input and the memory control signal and the information transfer control signal are shown as output.

6. The truth tables formed as described above provide the internal structures of the transition state calculator C111 and the transition state memory C112, which constitute the transition state generator C11, and the internal content of the control signal generator C12. Generally, it is easy to convert a truth table to a logic circuit, so that the transition state calculator C111 and the control signal generator C12 are easily converted to combinations of logic elements and wirings equivalent to the truth tables showing functions thereof. In addition, the transition state memory C112 comprises a plurality of registers and each register can be converted to a combination of logic elements and wirings. In this way, the internal structure of the information control section C1 is built by the combinations of logic elements and wirings.

7. Then, the internal structure of the information processing section C2 is decided. More specifically, function circuits (computers) corresponding to instructions in the state transition diagram (instructions showing kinds of operations) are prepared, and memory circuits are produced from all of the instructions in accordance with the number of kinds of operands (informations showing objects of the operations) while avoiding duplication. However, literal operands (literal constants) are not included. In addition, there are some cases where the memory circuits are not disposed at the input/output parts of the information processing section C2.

Thereafter, it is checked that an input of each memory circuit is conducted by how many kinds of memory circuits and value generating circuits. Then, an information transfer circuit, which has selective input terminals as many as the kinds of the memory circuits and the value generating circuits and a data width equal to the memory circuit, it built. This information transfer circuit serves as a signal selecting circuit, outputs an information to the memory circuit, and receives an output from the other memory circuit to be input to the above memory circuit, an output from the value generating circuit, and outputs from the memory circuit and the value generating circuit which are also input to the logic operation circuit.

At this time, detailed contents of the logic operation circuit, value generating circuit, memory circuit, and information transfer circuit are not decided yet. Only bit widths and operation functions of these circuits are decided.

In case where it is instructed that operations of the same kind should be conducted by a plurality of states or where there is a register or a flag register used within a restricted state and an operating circuit or a memory circuit equivalent to the register is shareable, information transfer circuits are disposed at the input and output sides of the register and wiring is conducted in the same way as described above in accordance with an instruction of the operator.

Thereafter, these logic operation circuit, value generating circuit, memory circuit, and information transfer circuit are detailed into combinations of circuit elements in accordance with a composition rule which is previously included in the apparatus according to the bit widths and the operation functions, whereby the internal content of the information processing section C2 is built by a net list. This composition rule can be changed from the outside, so that even if the composition method is changed, the logic circuit generating apparatus of this embodiment copes with the change.

A description is given of a concrete method for building each element with reference to the state transition diagram of FIG. 2.

First of all, a concrete method for building the transition state generator will be described. The state transition diagram of FIG. 2 is scanned to detect a state name of each state and state numbers 00, 01, and 10 are given to the states S1, S2, and S3, respectively. Then, state numbers following to the state numbers 00, 01, and 10 are detected by directions of arcs, whereby state numbers 01, 10, and 00 following to the state numbers 00, 01, and 10, respectively, are found. Thereby, a truth table illustrating the operation of the transition state generator is formed as shown in the following table [1]. Accordingly, a transition state calculator, whose operation is represented by the truth table [1], is realized by a logic circuit and memories for storing an output from the transition state calculator are prepared. That is, registers (above-described memories) as many as the number of digits of a binary that represents the number of states in the state transition diagram are prepared. In this embodiment, since the number of states is three, two registers are prepared. Then, wiring is carried out so that output terminals of the registers may be connected to the transition position information and input terminals thereof may be connected to the transition state calculator C111, completing the internal structure of the transition state generator.

TABLE 1

| input current state No. | output next state No. |
|---|---|
| 00 | 01 |
| 01 | 10 |
| 10 | 00 |

A description is given of a concrete method for building the control signal generator. The states in the state transition diagram of FIG. 2 and the instruction in each state are scanned to detect a register to which a signal is input (hereinafter, referred to as a register at input side). Then, according to the kind of the instruction, a register to be referred is found by a scanning. In FIG. 2, at the state number 00, since the register reg1 is at input side, the memory control signal is decided so that "1" is input to the reg1 (this means that write will be conducted) and "0" is input to the reg2 (this means that the value of the reg2 will be hold). In addition, the information transfer control signal is a signal for changing the connection of the information transfer circuit. The value "1" generating circuit is at referred side at the state number 00, the monadic addition circuit is at referred side at the state number 10, and the register reg1 is at referred side at the state number 01. Therefore, the information transfer control signal is decided so that "0" is obtained at the state number 00 (this means that the information transfer circuit is controlled to select the monadic addition circuit), "1" is obtained at the state number 10 (this means that the information transfer circuit is controlled to select the value "1" generating circuit), and "x", i.e. "don't care" is obtained at the state number 01. Thereby, a truth table illustrating the operation of the control signal generator is formed as shown in the following table [2]. Accordingly, when the control signal generator, whose operation is represented by the truth table [2], is realized by a logic circuit, the internal structure of the control signal generator is built.

TABLE 2

| input state No. | output | | |
|---|---|---|---|
| | information transfer control signal | memory control signal | |
| | | reg 1 | reg 2 |
| 00 | 1 | 1 | 0 |
| 01 | X | 0 | 1 |
| 10 | 0 | 1 | 0 |

A description is given of a concrete method for building the information processing section. The state transition diagram of FIG. 2 is scanned to detect an instruction that corresponds to each state number. First of all, the state number 01 will be described. Since instructions corresponding to the state number 01 are ADD, reg1, and reg2, a dyadic adder and two registers are prepared. Then, it is detected whether the register reg1 is used in another statement or not while scanning the registers reg1 and reg2. In the state transition diagram of FIG. 2, the register reg1 is used in another statement and appears twice in the input side in the statement. Therefore, an information transfer circuit having two inputs and an output is formed. In the same way, it is detected whether the register reg2 is used in another statement or not. In FIG. 2, the register reg2 is not used in another statement, so that no information transfer circuit is formed for the register reg2.

An instruction corresponding to the state number 00 is MOVE and no operation circuit is required for this instruction, so that only a value "1" generating circuit is prepared.

Now, connection of thus prepared operation circuit will be described. First of all, the registers reg1 and reg2 are scanned to detected that the register reg1 has two inputs. Then, the output terminal of the information transfer circuit is connected to the input terminal of the register reg1. When the whole state transition diagram is scanned to detect the input side of the information transfer circuit, it is found that the register reg1 is at the input side at the state number 00 and the state number 10. Therefore, the value "1" generating circuit and the monadic addition circuit are connected to the input terminal of the information transfer circuit.

In the same way as described above, input of the register reg2 is detected. Since it is input from only the ADD at the state number 01, the output terminal of the dyadic addition circuit is connected to the input terminal of the register reg2.

At the state number 10, it is found that the register reg1 is input to the INC, so that the output terminal of the register reg1 is connected to the monadic addition circuit.

Since the information transfer control signal is defined as a signal controlling the information transfer circuit, this signal is connected to the control input of the information transfer circuit. In addition, the memory control signal is input to the registers reg1 and reg2.

In this way, the information processing section is built.

In the step 105, internal data showing the internal structures of the information control section and the information processing section are converted to a net list 107 as a final product of the logic circuit generating apparatus of the present invention.

In the step 106, according to an instruction by the operator, a composition information 108 including circuit informations of the logically composed circuit, such as delay time, number of logic elements, and the like, is formed.

Figure 8A:
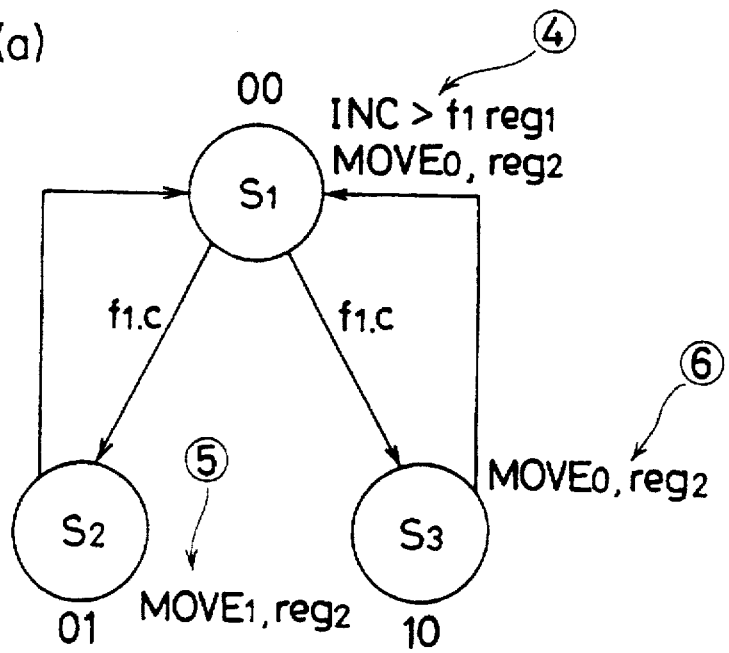
FIGS. 8(a)–8(b) are diagrams showing another example of state transition.
Figure 8B:
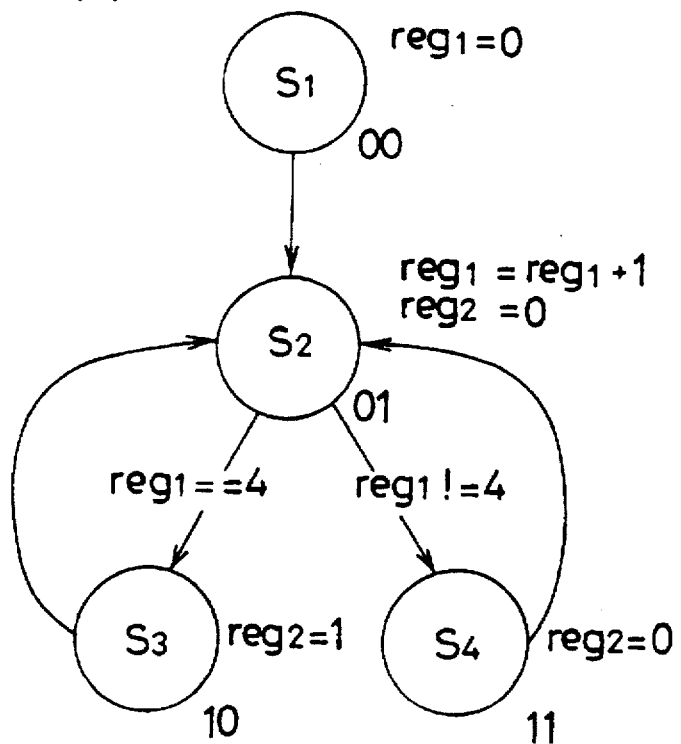

Although each state is followed by only one state in the above-described embodiment, a state may be followed by a plurality of states as shown in a state transition diagram of FIG. 8. Also in this case, an automatic generation of a logic circuit is possible by the logic circuit generating apparatus of the present invention.

In the state transition diagram of FIG. 8, in state S1, content of the register 1 is increased by "1" and stored in the register 1, and an operation result information is input to a flag register f1. Then, a value "0" is stored in the register 2 and when a carry appears, a value "1" is stored in the register 2 in state S2. When no carry appears, a value "0" is stored in the register 2 in state S3. This state transition diagram shows an operation of a frequency divider which divides a reference clock and outputs a pulse at a cycle equal to the width of the register from its output terminal when a carry appears.

In FIG. 8, S1, S2, and S3 show transition states and ④, ⑤, and ⑥ show processing contents in the respective states. In state S1, a value "1" is added to the register reg1 and the result is input to the register reg1. Then, an operation result information is input to the flag register f1 and a value "0" is input to the register reg2. A state following to the state S1 is univocally decided with referring to a carry signal in the flag register f1. That is, when the carry signal is set in the flag register f1, the state S2 is selected as a state to be processed next, and when it is not set, the state S3 is selected.

Similarly, the state S2 of FIG. 8 shows that a value "1" is input to the register reg2 and the state S2 is followed by the state S1. In addition, the state S3 shows that a value "0" is input to the register reg2 and the state S3 is followed by the state S1.

There is no fundamental difference between a method for constructing each part from the state transition diagram shown in FIG. 8 wherein the conditional branch is present and a method for constructing each part from the state transition diagram shown in FIG. 2 wherein the conditional branch is absent. Therefore, a concrete method for constructing each part will be described in reference to the state transition diagram of FIG. 8. Even if the number of states and the number of branches are larger than those of FIG. 8, this construction method can be employed with the same procedure.

Figure 9:
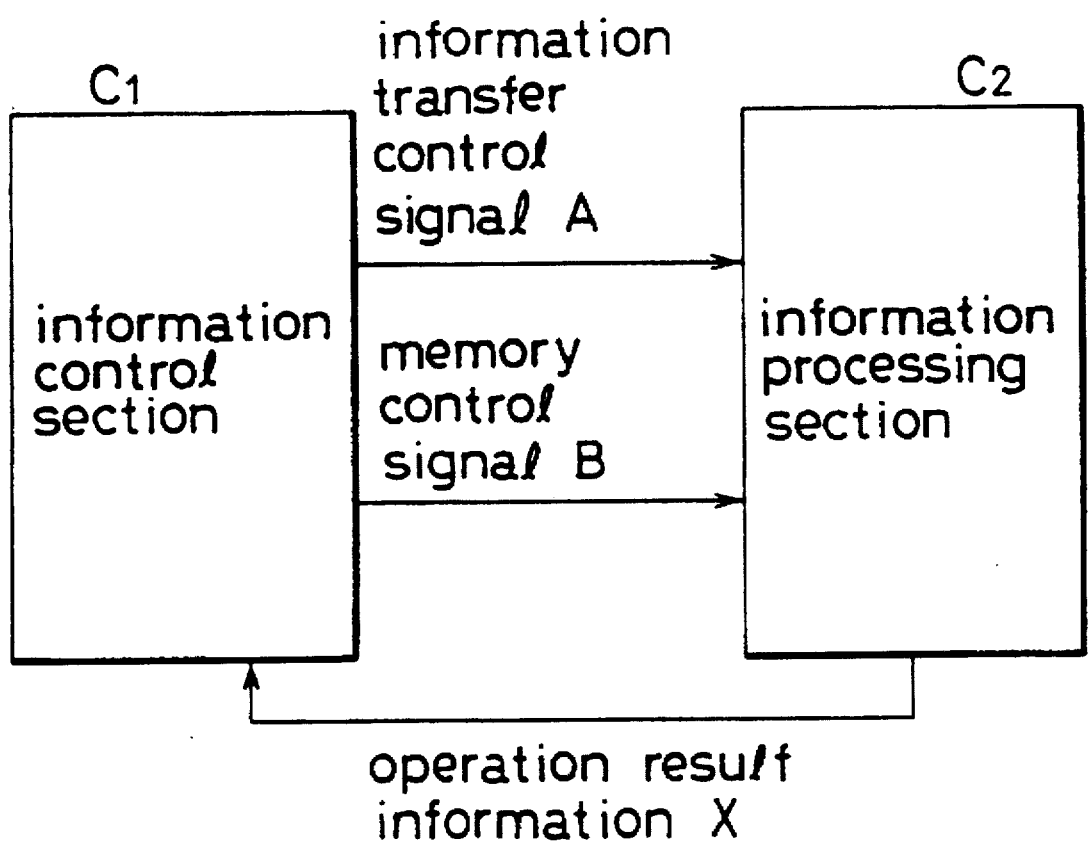
FIG. 9 is a diagram in which a function of a logic circuit, whose specifications are described in accordance with the state transition diagrams 8(a) and 8(b), is divided broadly.

FIG. 9 is a block diagram showing a state where functions to be included in a logic circuit are divided into two in case where the conditional branch is present as shown in FIG. 8. In this case, in addition to the information transfer control signal and the memory control signal, there is a path for a feedback of an operation result information X from the information processing section C2 to the information control section C1. At this time, content of the operation result information X is not decided yet.

Figure 10A:
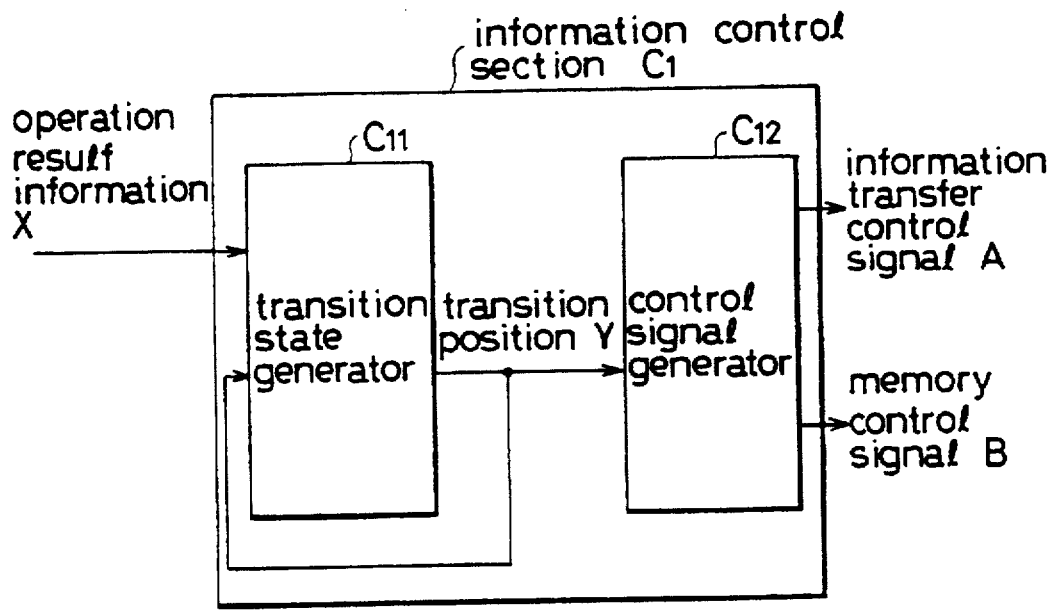
FIGS. 10(a) and (b) are block diagrams in which an information control section of FIG. 9 is detailed.
Figure 10B:
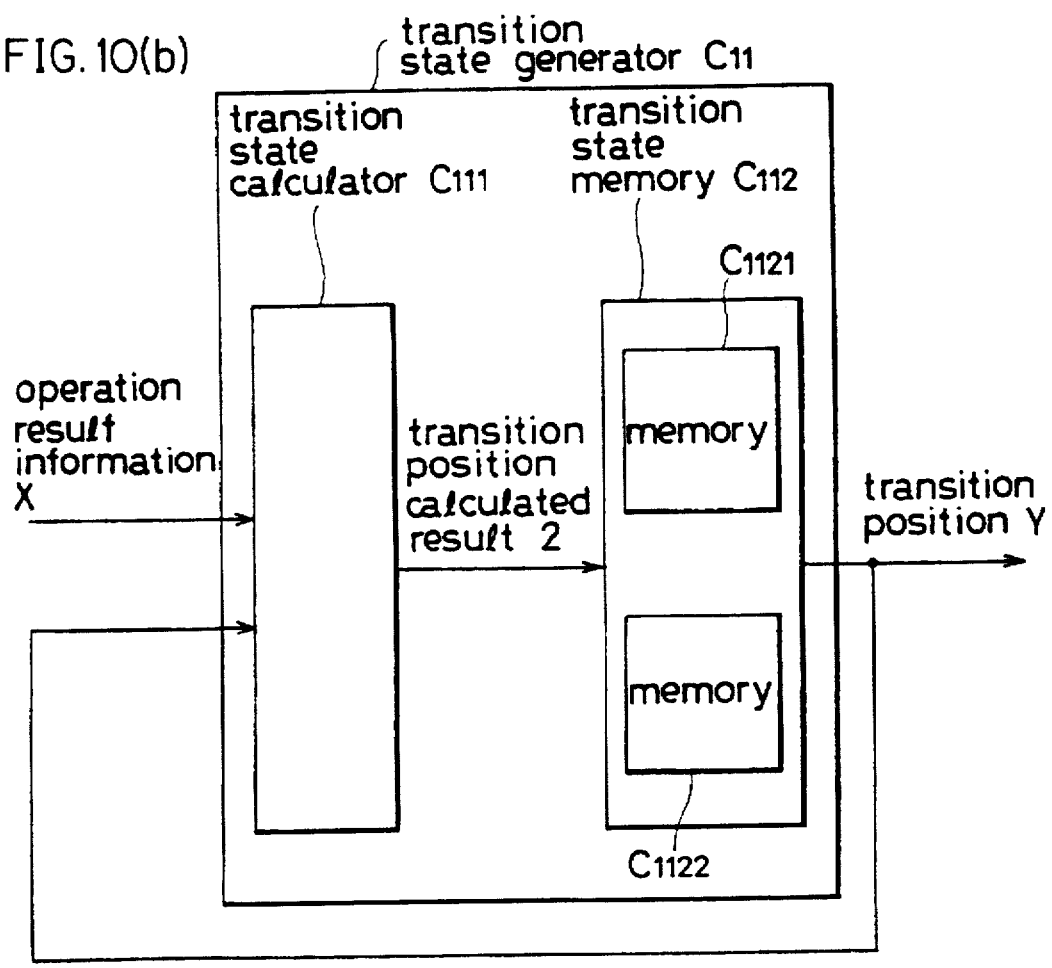

FIG. 10(a) is a block diagram showing the internal structure of the information control section C1 in more detail. While the transition state generator of FIG. 4(a) calculates following transition position on the basis of the current transition position only, the transition state generator of FIG. 10(a) calculates following transition position to follow on the basis of the operation result information X from the signal processing section and the current transition position. FIG. 10(b) is a block diagram showing the transition state calculator C111 and the transition state memory C112, which are included in the transition state generator C11. Tables [3] and [4] are truth tables showing operations of the transition state generator and the control signal generator, respectively. While the table 4 is formed in the same way as the table 2, the way to form the table 3 is a little different from that of the table 1. More specifically, in order to form the truth table 3, the operation result information X is also used as an input in addition to the input transition position Y which is used as an input when the truth table 1 is formed, and a transition state position to be processed next in accordance with these conditions Y and X is used as an output. An input-output relation of the truth table 3 is specified by the connection (arc) between states in the state transition diagram and its condition. In addition, an operation circuit in the information processing section calculates the operation result information (transition selecting section signal) X, independently of an original operation of the operation circuit. This operation result information X comprises informations, such as parity check, carry, borrow, and the like, and informs the control signal generator which state should follow the current state. The operation result information X may be a value obtained by comparing values of two memories like operators== in a so-called C language or a value obtained by logically operating the compared true and false values.

TABLE 3

| | input | |
|---|---|---|
| current state No. | operation result information fl. C | output next state No. |
| 00 | 1 | 01 |
| 01 | 0 | 10 |
| 10 | X | 00 |
| 0.1 | X | 00 |

TABLE 4

| input | output | | |
|---|---|---|---|
| | information transfer | memory control signal | |
| state No. | control signal | reg 1 | reg 2 |
| 00 | 0 | 1 | 1 |
| 01 | 1 | 0 | 1 |
| 10 | 0 | 0 | 1 | structure of the information processing section of FIG. 9 in more detail.

Figure 11:
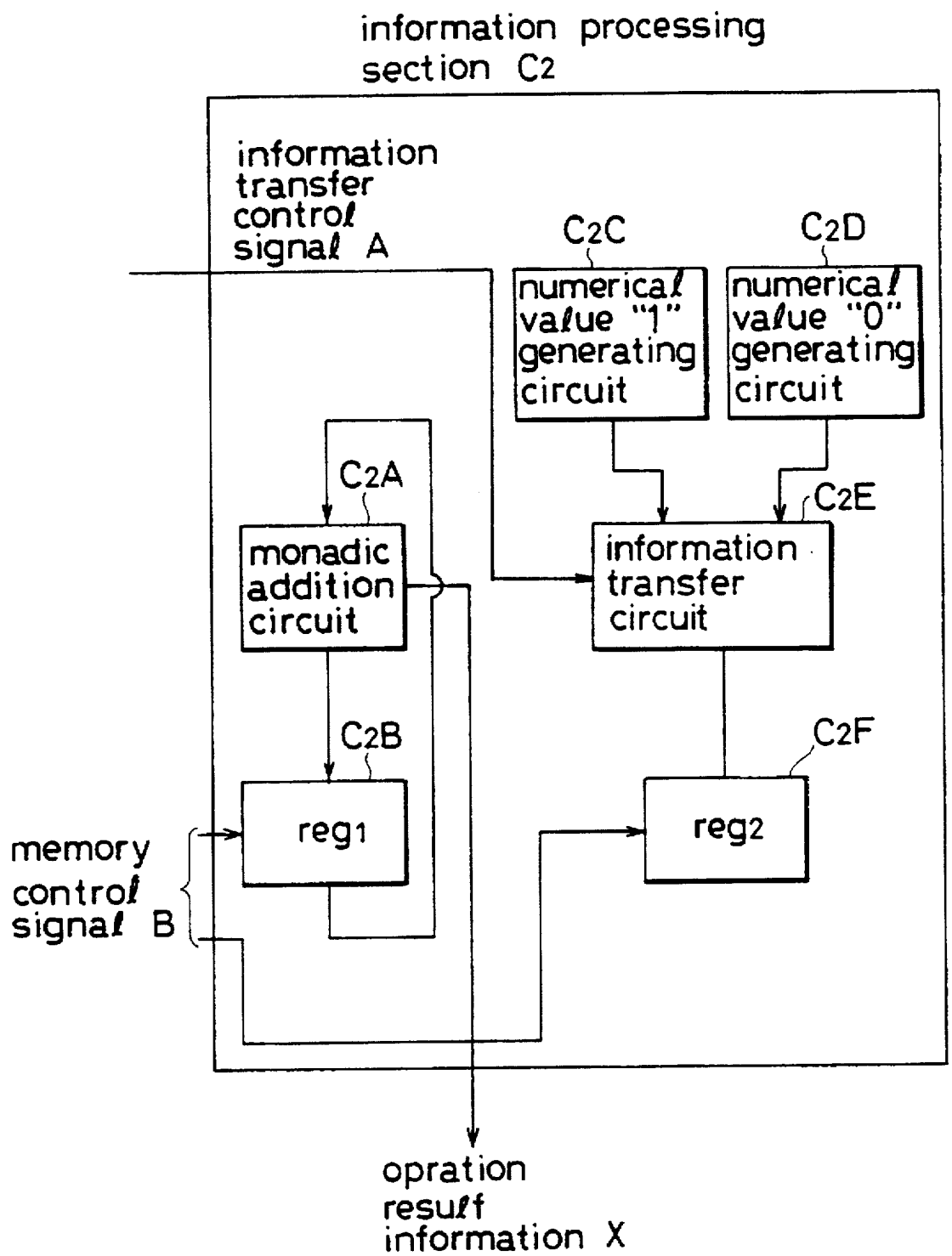
FIG. 11 is a block diagram in which an information processing section of FIG. 9 is detailed.
Figure 12:
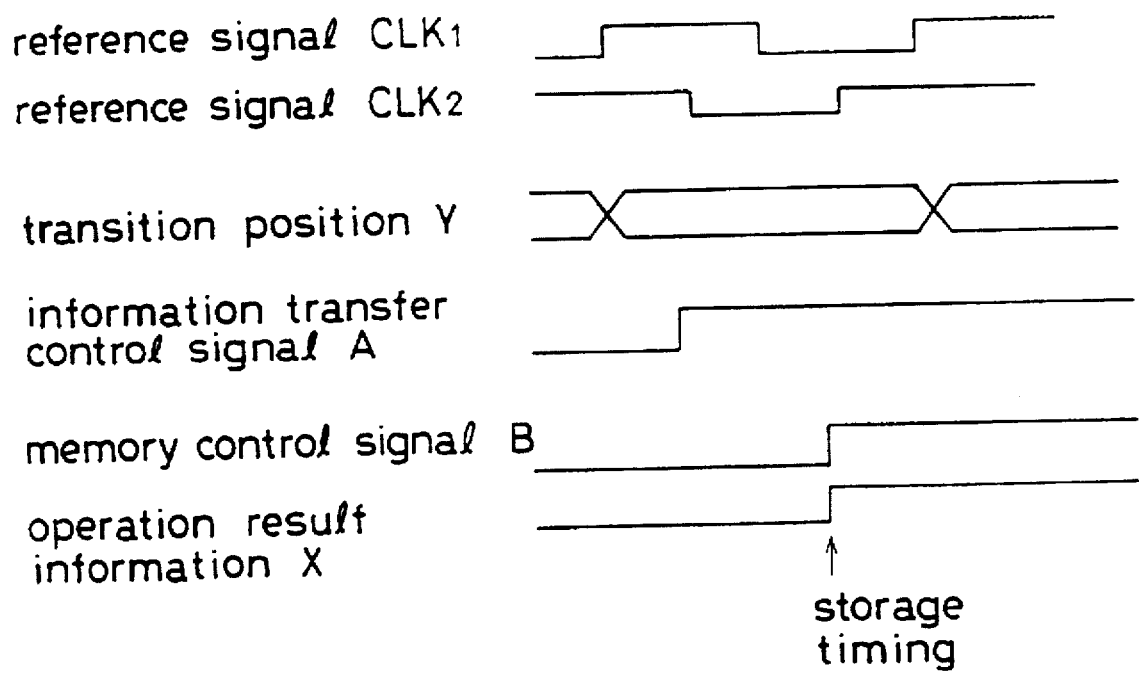
FIG. 12 is a diagram showing timings of control signals output from the information control section and the information processing section of FIG. 9.

A monadic addition circuit C2A of FIG. 11 outputs a result of the addition to the register reg1 C2B and outputs a carry to a flag register f1 of the addition circuit C2A itself. The carry, i.e., the operation result information X, is output from the flag resister f1 to the transition state generator of the information control section.

It is needless to say that each function block of FIG. 11 is converted to a net list at gate level like shown in FIG. 7.

According to the first embodiment of the present invention, since the functional specifications to be included in the logic circuit are input as the state transition diagram, the logic circuit can be automatically generated by only forming the state transition diagram that represents the functional specifications naturally and compactly, whereby the logic circuit can be designed in a short development time without requiring knowledge of the logic circuit. The logic circuit to be designed is divided into the information control section and the information processing section, the information control section is divided into the transition state generator and the control signal generator, these generators are divided into a plurality of blocks and wirings between the blocks which are realized by logic elements, and the information processing section is divided into a plurality of blocks and wirings between the blocks. That is, a so-called top-down system is employed to compose a net list. As the result, an apparatus for automatically generating a logic circuit, which has no dependency on the library (a set of circuit elements used for the composition), is achieved. In addition, this apparatus can cope with a change of use of the logic circuit or a change of specification of the net list.

While in the above-described first embodiment an object of the logic circuit is the net list, a logic circuit diagram or a HDL may be output instead of the net list.

While in the above-described first embodiment only the net list is output, intermediate products, such as the information control section, the information processing section, or a net list at functional level which is obtained by further detailing these elements, may be output to the outside. In this case, for example, when a logic circuit, in which a specified part thereof is formed by the apparatus of the present invention while the other part is formed by manual operation, is simulated, a net list at functional level is output and the simulation may be performed using the net list, whereby time for verifying the circuit is significantly reduced as compared with a case where the simulation is performed using a net list at cell level.

In the above-described first embodiment, the internal structure of the information processing section comprises the registers, the addition circuits, the information transfer circuit (selector), and the value generating circuit, which are constituted by the net list at cell level. However, general registers, every combinational logic circuit, a specific combinational logic circuit, and a connection may be employed instead of the memory circuits, the logic operation circuits, the signal selecting circuit, and the value generating circuit, respectively. Also in this case, the same effects as described above are obtained.

In addition, although the state transition diagram is input in the above-illustrated first embodiment, a petri net may be input if appropriate conversion and separation means are provided.

Figure 13:
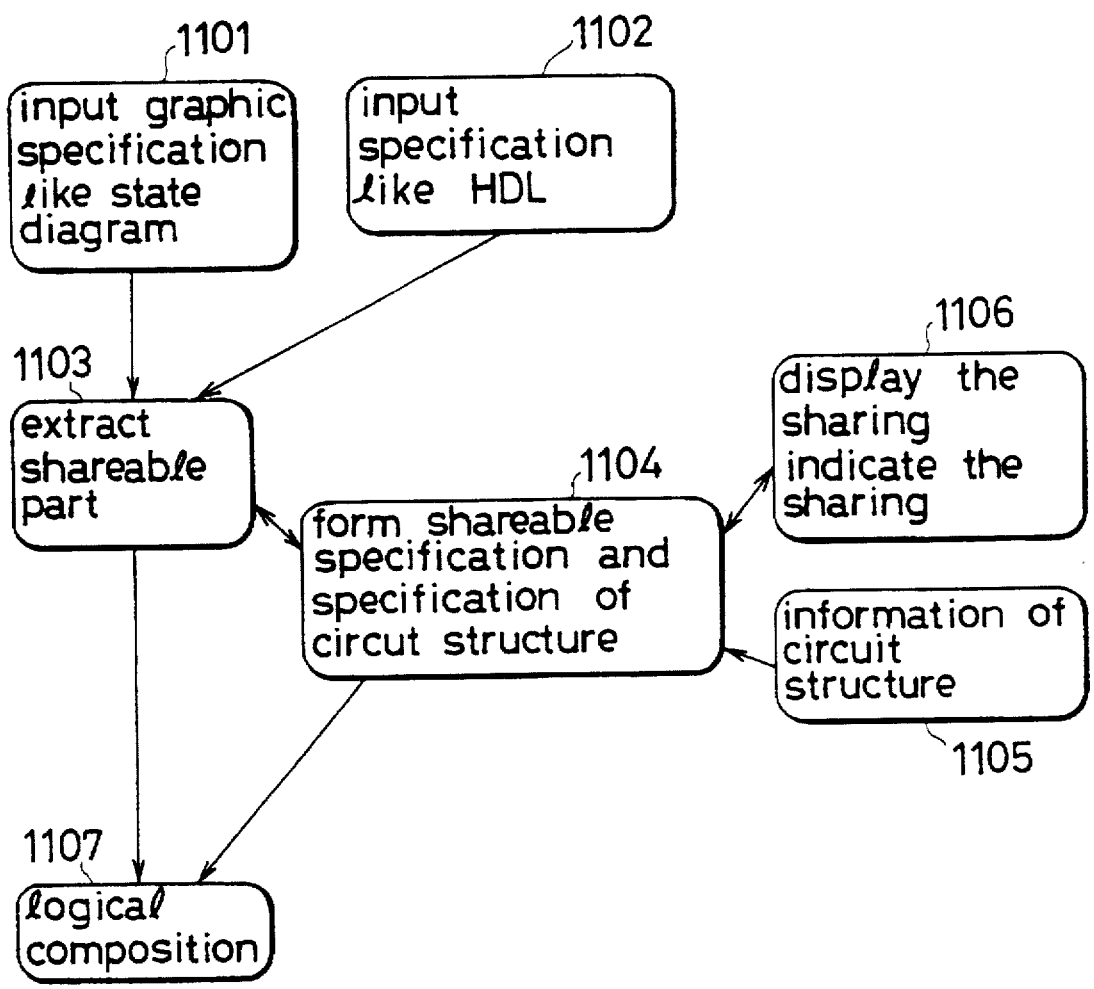
FIG. 13 is a flow chart showing steps in a logic circuit composing process executed in the apparatus of FIG. 1 in accordance with a second embodiment of the present invention.

A description is given of a second embodiment of the present invention. FIG. 13 illustrates process steps executed in the work station computer 1 shown in FIG. 1 in accordance with the second embodiment of the present invention. In this second embodiment, specifications are easily made out, informations relating to a structure of a circuit to be composed are easily understood, and a logic circuit is automatically generated with high efficiency. In step 1101, specifications of a logic circuit to be composed are input to the work station computer 1 by a graphic manner such as a state diagram. In step 1102, the specifications are input by HDL. Either or both of the steps 1101 and 1102 is/are employed depending on the easiness of the description of specifications. In step 1103, portions of the input specifications, which can be realized by a common circuit block, are extracted. The informations extracted in the step 1103 are used as basic data in the following step 1104 in which shareable specifications and circuit composing specifications are formed. Therefore, data manipulation for the input specifications is not carried out in the step 1103. In the step 1104, the shareable block is displayed to the operator and, at the same time, schematic specifications of a circuit to be composed are displayed. Since the shareable block and the schematic specifications are graphically displayed, the operator precisely recognizes the input specifications and the shareable portion of the circuit to be composed. On the basis of the informations thus displayed, in step 1106, the operator makes changes in the shareable block and in the schematic specifications of the circuit to be composed, whereby shareable specifications of the circuit to be composed are decided. Since the changes are graphically made, the decision of the shareable specifications is easily conducted. Similarly, in step 1107, the circuit composing specifications are input. Since the circuit composing specifications are input by selecting required informations from the graphic input, the input is easily conducted. Finally, the shareable specifications, the circuit composing specifications, and the data showing the specifications of the circuit to be composed, which have previously been input by the operator, are input to a logic composition section.

Figure 14:
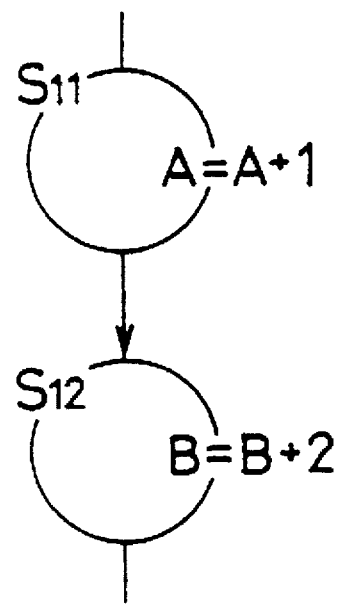
FIG. 14 is a state diagram showing a part of a specification input which is a request specification of the apparatus of FIG. 1, in accordance with the second embodiment of the present invention.

FIG. 14 is a state transition diagram illustrating a part of the specification input. According to the data shown in FIG. 14, the operation of the second embodiment will be described. In FIG. 14, in state S11, a value "1" is added to a content of a variable A and the result is input to the variable A. In state S12, a value "2" is added to a content of a variable B and the result is input to the variable B. Generally, the specification "A=A+1" shown in the state S11 is realized by connecting a memory storing the value of the variable A, a block generating the value "1", and a block conducting the addition with each other. Similarly, the specification "B=B+2" shown in the state S12 is realized by connecting a memory storing the value of the variable B, a constant generating block generating the value "2", and a block conducting the addition with each other.

Figure 15:
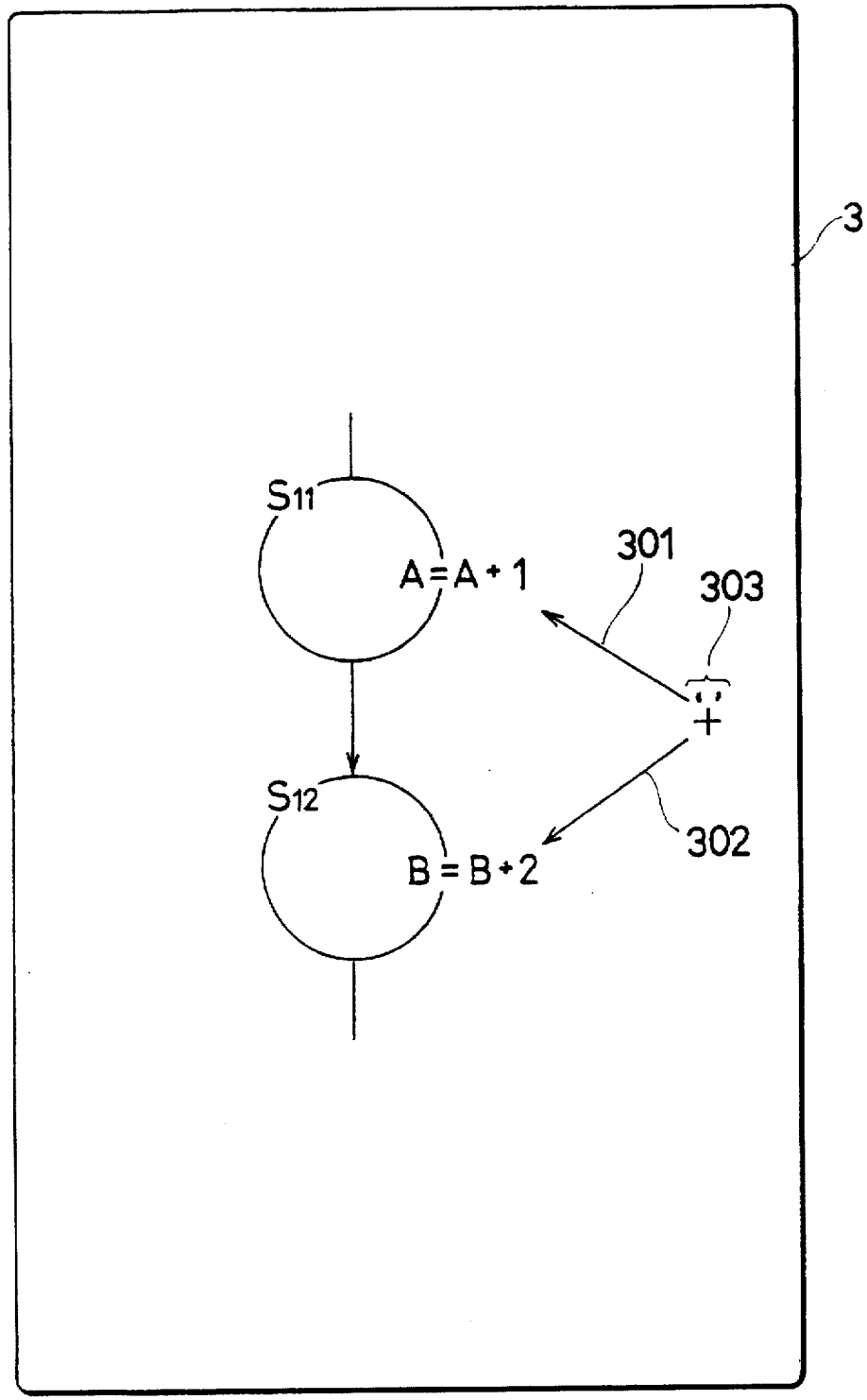
FIG. 15 is a diagram showing a state where an extracted function block is graphically displayed to an operator, in accordance with the second embodiment of the present invention.

Meanwhile, if the processes in the states S11 and S12 are successively carried out in the state diagram shown in FIG. 14, the blocks conducting the additions in the states S11 and S12 can be unified. More specifically, in the actual data, operation blocks, such as adders, and memories, which are required for the circuit composition, are extracted and then blocks, which are not used within the same period, are extracted as the blocks that can be unified. Then, the extracted functional blocks are graphically displayed as shown in FIG. 15. In FIG. 15, it is shown by arrows 301 and 302 and symbol '+' 303 that the adders can be unified and shared by the+operators of the states S11 and S12. Then, the operator instructs the work station computer 1 using the mouse 4 to execute the sharing.

While in the above description the operator designates the shareable part direct, the designation may be automatically carried out. Also in this case, display and correction of the shareable part are conducted in the same manner as described above. At this time, auxiliary informations for the composition of the circuit by the circuit composing specifications are input. Here, not only the shareable part but also circuit configurations for realizing operators and the other control circuits are designated. In addition, in each circuit configuration, it is indicated whether the circuit is composed with reducing the number of elements or with increasing the operating speed of the circuit to be composed.

In this way, the shareable specification and the circuit composing specification are decided. These informations are sent to the logic composition section. In the logic composition step 1107, before composing a circuit, the specification input is converted so that the sharing can be conducted. More specifically, an input selecting circuit having input terminals as many as the number of circuits that share a block is disposed at the input side of the shared block and a control circuit is disposed between those circuits and the input selecting circuit. When one of the circuits requires the function of the shared block, the control circuit controls the input selecting circuit so that may selects an input of the circuit. At this time, the converted output is represented by a HDL of de facto standard, so that the subsequent steps in the logic composition process are conducted by the other conventional logic composing apparatus.

While in the above-described second embodiment, the circuit block having one function, i.e., adder, is shared, a circuit block having a plurality of functions, for example, an addition and subtraction circuit may be shared. In this case, a plurality of functions are extracted as a shared object when the blocks to be unified and shared are extracted, and a control signal for conducting circuit function selection in addition to the control of the input selecting circuit is generated in the logic composition section. In addition, even blocks having different word lengths (bit widths) can be unified and shared. In this case, when the blocks to be unified are extracted, operation blocks having the same functions and different word lengths are extracted as a shared object, and a circuit for adjusting the word lengths is provided in the logic composition section. If the operation blocks extracted as a shared object have word lengths longer than an optimum word length for realizing the specification, the number of circuit blocks to be unified is increased.

Figure 16:
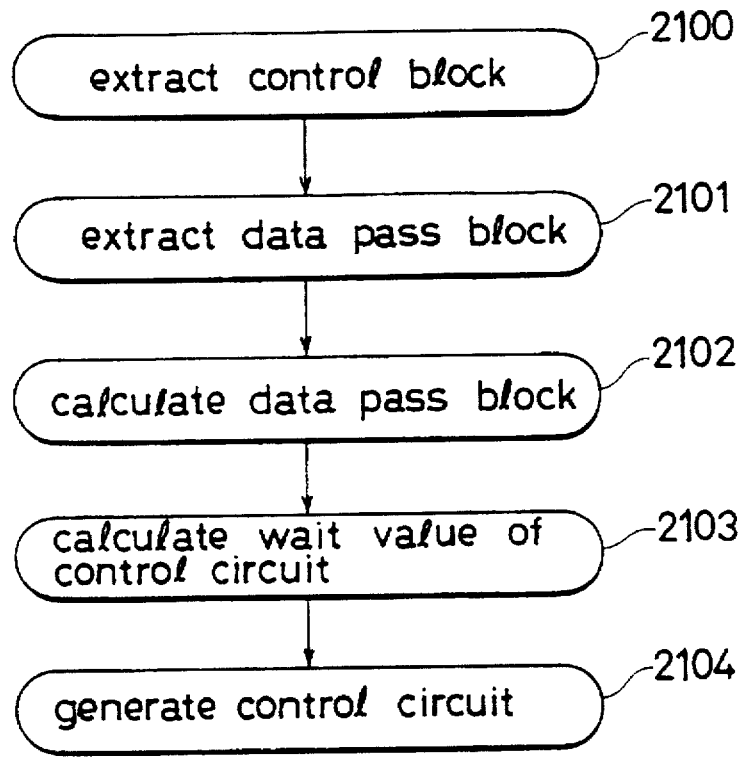
FIG. 16 is a flow chart showing a process executed in a logic circuit automatically generating apparatus in accordance with a third embodiment of the present invention.

A third embodiment of the present invention will be described using a flow chart shown in FIG. 16. According to this third embodiment, operating speed of the whole logic circuit is not restricted by an operation that takes the longest processing time among operations of circuit blocks, whereby a high-speed logic circuit is achieved even if the size of the logic circuit is very large. In FIG. 16, an upper structure extracting function, i.e., a function for diving a logic circuit satisfying request specifications into an information processing section and an information control section, is shown by processing blocks.

In a processing block 2100, a control block (information control part) is extracted. More specifically, an input specification is divided into an information processing part for processing the data and an information control part for controlling the information processing part. Then, the information control part is extracted as a controller generating a control signal required for a trigger causing an operation and the operation conducted by the trigger.

In a processing block 2101, a data pass block (information processing part) is extracted. More specifically, the information processing part, which is extracted in the control block extracting section 2100, is extracted as a structure that can be realized by actual circuits.

In a processing block 2102, the data pass block is calculated. More specifically, time required for an operation of each circuit extracted in the data pass block extracting section 2101 is calculated from the actual circuit or schematically calculated from the specifications.

In a processing block 2103, wait value of a control circuit is calculated. More specifically, wait value of fundamental clock is calculated so as to satisfy the time obtained in the data pass block calculating section 2102.

In a processing block 2104, the control circuit is generated. More specifically, the control circuit is generated with the wait value (delay time), which is obtained in the control circuit wait calculating section 2103, as a specification of the controller which is extracted in the control block extracting section 2100.

Figure 17:
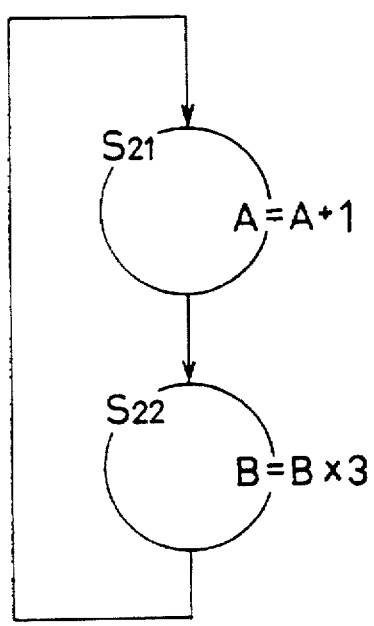
FIG. 17 is a state diagram showing a part of a specification input which is a request specification of the apparatus of FIG. 1, in accordance with the third embodiment of the present invention.

Then, internal operations will successively be described in accordance with a state diagram shown in FIG. 17. In FIG. 17, in state S21, a value "1" is added to a variable A and the result is input to the original variable A. In state S22, a variable B is multiplied by a value "3" and the result is input to the original variable B. In addition, the state S21 changes to the state S22 when the operation "A=A+1" is completed and the state S22 changes to the state S21 when the operation "B=B×3" is completed.

First of all, in the control block extracting section 2100, a controller, which indicates that the state S21 should be followed by the state S22 and the state S22 should be followed by the state S21, is extracted as a sequence machine. Then, in the data pass block extracting section 2101, an adder is composed by the specification in the state S21 and a multiplier is composed by the specification in the state S22. Thereafter, in the data pass block calculating section 2102, transfer delay times of circuits constituting the adder and the multiplier are calculated, respectively. Then, in the control circuit wait calculating section 2103, a delay time required for each circuit is obtained from a ratio of the transfer delay time and a fundamental clock used in the circuit, i.e., a wait value of the fundamental clock is obtained. Finally, in the control circuit generating section 2104, a control block is completed so that the state changes with the wait value.

According to the third embodiment of the present invention, the sequence machine, which controls a circuit to be composed, includes an auxiliary counter function for generating a control signal at a speed corresponding to the operating speed of each state of the data pass block which is a circuit to be controlled. Then, a value obtained by automatically calculating the operating speed of each circuit to be controlled is set in the auxiliary counter function part. Therefore, a part controlling the circuit to be composed is not required for every state and is achieved by a small circuit, whereby an apparatus for generating a circuit, which operates at high speed even when it is very large in scale, is automatically constructed.

In the above-illustrated third embodiment, although an operation is designated in a state, even when a plurality of operations are designated in a state, a required wait value is obtained by calculating the maximum delay time and a logic circuit is composed in the same manner.

In addition, even when a condition is described in the state transition, a circuit composition can be achieved by adding the condition to the state transition in the control block extracting section.

In addition, if the wait value is direct input to the description of the circuit specifications, an operation having a timing at a reference clock unit can be easily described.

In the above-illustrated embodiment, although the request specifications are input by the state transition diagram, the request specifications input by HDL may be divided into the information processing part and the information control part. Also in this case, the same effects as described above can be obtained.

As is evident from the foregoing description, according to a present invention, when a request specification represented by a state transition diagram is input to an apparatus for automatically generating a logic circuit, the apparatus divides the specification into an information control part and an information processing part, divides the information control part into a transition state generator and a control signal generator, and specifies the transition state generator, the control signal generator, and the information processing part, as combinations of circuits, which are realized by combinations of logic elements and wirings, and wirings connecting the circuits. Therefore, the apparatus can cope with a change of use of the logic circuit, a change of a library of a final product, and the like. In addition, when only the state transition diagram, which represents request functions of the logic circuit naturally and compactly and which is easily described by an operator, is input to the apparatus, a large scale logic circuit can be automatically generated, thereby significantly reducing a time for a development of the circuit.

According to the present invention, in order to generate an effective circuit, informations relating to a structure of a circuit to be composed but not direct relating to the request specifications are represented by a diagram. Therefore, the specifications are easily made out, resulting in an apparatus with high efficiency.

According to the present invention, informations relating to a structure of a circuit to be composed but not direct relating to specifications for generating the circuit are represented by a diagram, so that specifications can be easily made out. In addition, the informations relating to a structure of a circuit to be composed are input by a diagram, so that the contents thereof are easily understood. In addition, since the informations relating to a structure of a circuit to be composed are input from the outside by a diagram, the informations are easily input. As the result, an apparatus with high efficiency can be achieved.

According to the present invention, portions of specifications thus described, which portions can be unified and realized by an object of logic circuit, are automatically extracted and displayed as a diagram to an operator. Therefore, informations relating to a structure of a circuit to be composed are represented by a diagram, so that specifications can be easily made out. In addition, the informations relating to a structure of a circuit to be composed are easily understood by the diagram. In addition, the operator can indicates the shareable circuit with a support of the apparatus. As the result, an apparatus with high efficiency can be achieved.

According to the present invention, portions of specifications thus described, which portions can be unified and realized by an object of logic circuit, are automatically extracted and displayed as a diagram to an operator. At the same time, portions, which are realized by an object of logic circuit and are not included in the above-described specifications, are designated by a graphic input by an operator. Therefore, informations relating to a structure of a circuit to be composed are represented by a diagram, so that specifications can be easily made out. In addition, the informations relating to a structure of a circuit to be composed are easily understood by the diagram. In addition, even portions, which cannot be unified and shared by the support of the apparatus, can be indicated by the operator, resulting in an apparatus with high efficiency.

According to the present invention, a circuit, which generates a control signal at a speed corresponding to a performance of a circuit to be controlled, is disposed in a part serving as a controller for the circuit to be composed. Therefore, a high-speed circuit can be generated even when the circuit is very large in scale.

According to the present invention, an auxiliary counter function is provided in the part serving as a controller for the circuit to be composed. Therefore, a circuit of the part serving as a controller can be simplified.

According to the present invention, a value obtained by automatically calculating an operating speed of every circuit to be controlled is used as a value to be set in the auxiliary counter function. Therefore, a circuit, that generates a signal adjusted to the operating speed of each state, can be composed without requiring manual operation.

What is claimed is:

1. An apparatus for automatically generating a logic circuit comprising:

transition information inputting means for extracting a transition information between states in a state transition diagram which is input to the apparatus;

processing content inputting means for extracting a processing content of each state in the state transition diagram; and logic circuit object generating means for automatically generating an object of a logic circuit in an expression style in accordance with the transition information between states and the processing content in each state, said logic circuit object generating means comprising:

intermediate product generating means for generating an intermediate product comprising an information control part, which outputs an information transfer math control signal that selects a transfer path of an information and a memory control signal that specifies some of a plurality of memories and controls a write timing of each specified memory, and an information processing part, which includes operators that operate said processing content in each state in said state transition diagram and memories that store results of the operations and conducts the operations in accordance with said information transfer path control signal and said memory control signal;

information control part building means for building said information control part by specifying said information control part as two generators, i.e., a transition state generator, which outputs a next transition position information in accordance with a control signal showing characteristics and contents of the operation results of the signal processing part and a transition position information output from said information control part itself, and a control signal generator, which outputs said information transfer path control signal and said memory control signal in accordance with the transition position information output from said transition state generator;

information control part specifying means for specifying said transition state generator and said control signal generator as combinations of memory circuits, logic operation circuits, signal selecting circuits, and numerical value generating circuits, which are realized by combinations of logic elements and wirings, and wirings between these circuits; and information processing part specifying means for specifying said information processing part as a combination of memory circuits, logic operation circuits, signal selecting circuits, and numerical value generating circuits, which are realized by combinations of logic elements and wirings, and wirings between these circuits, in accordance with instructions described in the state transition diagram.

2. The apparatus of claim 1 wherein said expression style of logic circuit is a hardware description language.

3. The apparatus of claim 1 wherein said information transfer path control signal decides which input should be selected when there are a plurality of registers and each register has a plurality of inputs.

4. The apparatus of claim 1 wherein said information processing part sends a transition selecting element signal to said information control part, which signal is a result of an operation in a state for deciding a transition from said state held in said information control part or results of previous operations.

5. The apparatus of claim 1 wherein said information control part building means builds an internal structure of said transition state generator using a truth table which provides an input-output relation of said transition state generator by each state in the state transition diagram and a state that follows said each state.

6. The apparatus of claim 1 wherein said information control part building means builds an internal structure of said transition state generator using a truth table which provides an input-output relation of said transition state generator by each state in the state transition diagram, a state that follows said each state, and said transition selecting element signal.

7. The apparatus of claim 1 wherein said information control part building means builds an internal structure of said transition state generator using a truth table which selects signals to be input to operators, which operators are indicated by states in the state transition diagram and by informations described in the state transition diagram, and provides an input-output relation of said control signal generator by kinds of memories to which signals are input in each state.

8. The apparatus of claim 1 wherein said information processing part specifying means provides operators in accordance with informations showing states in the state transition diagram and operations in instructions described in the state transition diagram and provides memories in accordance with informations showing objects of said operations, thereby to built an internal structure of said information processing part.

9. The apparatus of claim 1 wherein said information processing specifying means provides operators in accordance with informations showing states in the state transition diagram and operations in instructions described in the state transition diagram and provides memories in accordance with informations showing objects of said operations, thereby to build an internal structure of said information processing part so that said operators output said transition selecting element signal.

10. The apparatus of claim 1 wherein said expression style of logic circuit is a net list.

11. The apparatus of claim 1 wherein said expression style of logic circuit is a logic circuit diagram.

* * * * *